(12) United States Patent
Dennard et al.

(10) Patent No.: US 7,855,428 B2
(45) Date of Patent: Dec. 21, 2010

(54) CONDUCTIVE LINER AT AN INTERFACE BETWEEN A SHALLOW TRENCH ISOLATION STRUCTURE AND A BURIED OXIDE LAYER

(75) Inventors: Robert H. Dennard, Croton-on-Hudson, NY (US); Mark C. Hakey, Fairfax, VT (US); David V. Horak, Essex Junction, VT (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 12/115,699

(22) Filed: May 6, 2008

(65) Prior Publication Data
US 2009/0278226 A1 Nov. 12, 2009

(51) Int. Cl.
*H01L 21/76* (2006.01)
(52) U.S. Cl. .................. 257/508; 257/513; 257/E29.02; 257/E29.108
(58) Field of Classification Search .................. 257/513, 257/508
See application file for complete search history.

(56) References Cited

U.S. PATENT DOCUMENTS

| 4,825,278 A | 4/1989 | Hillenius et al. |
| 4,903,108 A | 2/1990 | Young et al. |
| 5,422,294 A | 6/1995 | Noble, Jr. |
| 5,770,484 A | 6/1998 | Kleinhenz |
| 6,274,919 B1 | 8/2001 | Wada |
| 6,420,749 B1 | 7/2002 | Divakaruni et al. |
| 6,555,891 B1 | 4/2003 | Furukawa et al. |
| 7,018,907 B2 | 3/2006 | Lee |
| 2002/0060320 A1* | 5/2002 | Iwamatsu et al. ............. 257/51 |
| 2003/0094654 A1* | 5/2003 | Christensen et al. ......... 257/347 |
| 2003/0122215 A1* | 7/2003 | Wilson ....................... 257/520 |
| 2004/0152280 A1* | 8/2004 | Lee ............................ 438/424 |
| 2007/0018328 A1* | 1/2007 | Hierlemann et al. ........ 257/762 |
| 2007/0284661 A1* | 12/2007 | Yamada et al. .............. 257/347 |
| 2009/0026572 A1* | 1/2009 | Dehlinger ................... 257/508 |
| 2009/0160009 A1* | 6/2009 | Dietz et al. ................. 257/506 |

* cited by examiner

*Primary Examiner*—Wael M Fahmy
*Assistant Examiner*—Abul Kalam
(74) *Attorney, Agent, or Firm*—Richard Kotulak; Roberts Mlotkowski Safran & Cole, P.C.

(57) ABSTRACT

The invention relates to a design structure, and more particularly, to a design structure for a conductive liner for rad hard total dose immunity and a structure thereof. The structure includes at least one shallow trench isolation structure having oxide material and formed in an SOI. A dielectric liner is formed at an interface of the SOI within the at least one shallow trench isolation structure. A metal or metal alloy layer is formed in the at least one shallow trench isolation structure and between the dielectric liner and the oxide material.

15 Claims, 3 Drawing Sheets

CONDUCTIVE LINER AT AN INTERFACE BETWEEN A SHALLOW TRENCH ISOLATION STRUCTURE AND A BURIED OXIDE LAYER

CROSS-REFERENCE TO RELATED APPLICATIONS

This application is related to U.S. Ser. No. 12/115,690 filed on the same day and currently pending.

FIELD OF THE INVENTION

The invention relates to a design structure, and more particularly, to a design structure for a conductive liner for rad hard total dose immunity and a structure thereof.

BACKGROUND

Ionizing radiation can cause single event upsets (SEUs) as well as total failure resulting from total dose (long accumulation of radiation) in semiconductor ICs. Ionizing radiation can directly upset storage circuits, such as SRAMs, register files and flip-flops. Moreover, radiation events in combinational logic create voltage glitches that can be latched. SEUs may cause the IC to perform incorrect or illegal operations; whereas, an accumulation of radiation over a long period of time may additionally lead to complete device failure.

By way of a more specific example, due to prolonged radiation exposure (total dose) a charge can build up at an interface between an oxide (STI) and an SOI. This build up will eventually change the charge flow at the SOI interface. This leads to shift in VT of the device. If the Vt is allowed to move further enough from the design point, the circuitry can fail to operate.

Methods to prevent SEUs and total dose include adding spatial and/or temporal redundancy, so that a single radiation event cannot cause an SEU. Redundancy solutions incur area, power and performance penalties. Consequently, there is a need to improve detection schemes of radiation events in ICs.

Accordingly, there exists a need in the art to overcome the deficiencies and limitations described hereinabove.

SUMMARY

In a first aspect of the invention, a structure comprises: at least one shallow trench isolation structure comprised of oxide material and formed in an Si; a dielectric liner formed at an interface of the Si within the at least one shallow trench isolation structure; and a metal or metal alloy layer formed in the at least one shallow trench isolation structure and between the dielectric liner and the oxide material.

In a further aspect of the invention, a design structure for a conductive liner for rad hard total dose immunity is embodied in a machine readable medium for designing, manufacturing, or testing an integrated circuit. The design structure comprises: at least one shallow trench isolation structure comprised of oxide material and formed in an Si; a dielectric liner formed at an interface of the Si within the at least one shallow trench isolation structure; and a metal or metal alloy layer formed in the at least one shallow trench isolation structure and between the dielectric liner and the oxide material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a design structure, and more particularly, to a design structure for a conductive liner for rad hard total dose immunity and a structure thereof. More specifically, the present invention teaches the use of a liner at an interface between an STI structure and SOI. This liner is formed in the STI structure prior to oxide fill. The liner will shield the active device from a charge build up in the STI Oxide.

Structures in Accordance with the Invention

Figure 1:
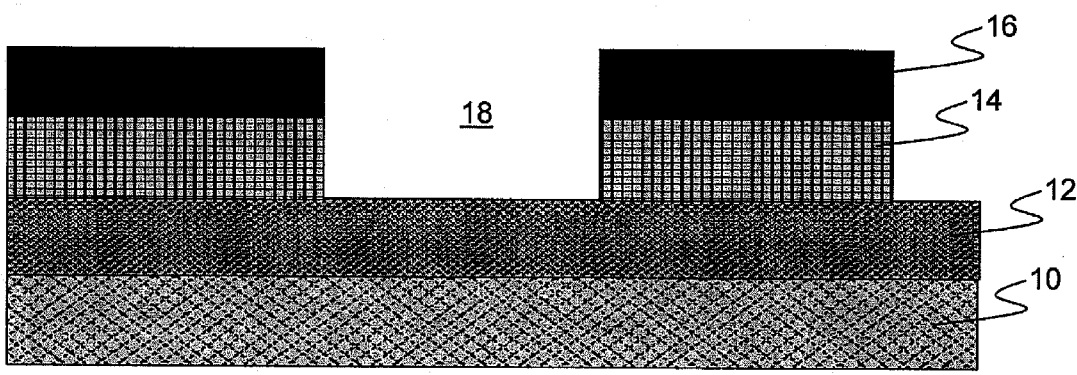
FIGS. 1 and 2 show beginning and intermediate structures and respective processing steps in accordance with the invention.

FIG. 1 shows a beginning structure and respective processing steps in accordance with a first aspect of the invention. Specifically, FIG. 1 shows a BOX 12 formed on a wafer 10 such as, for example, a silicon wafer. An SOI 14 is bonded to the BOX 12 in a conventional manner. The structure also can be formed by oxygen implant and anneal. As the structure thus far described is a conventional and commercially available structure, no further explanation is required herein.

Still referring to FIG. 1, a pad nitride (oxide) layer 16 is deposited on the SOI 14. In conventional lithographic and etching processes, shallow trenches 18 are formed in the structure and more specifically in the pad nitride layer 16 and the SOI 14. For example, a photolithographic masking layer (not shown) can be exposed to light to form openings, with a subsequent etching process (e.g., reactive ion etching (RIE)) to form the shallow trenches 18. Wet or dry resist/arc strip is used to remove the remains of the masking material. The shallow trenches 18 will be used to form shallow trench isolation (STI) structures.

Figure 2:
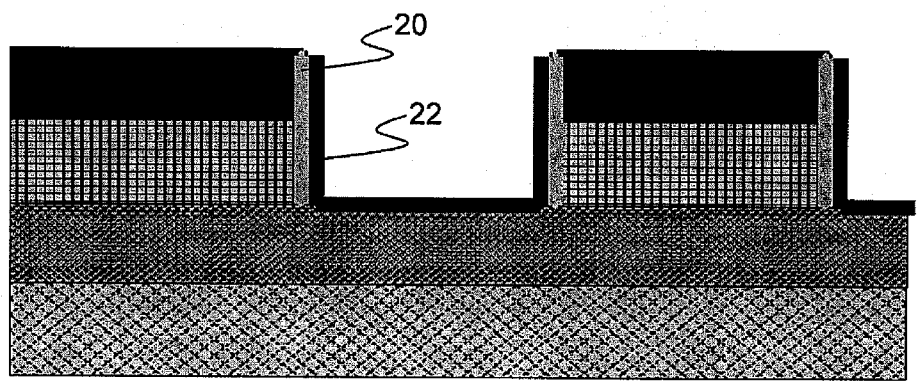

FIG. 2 shows an intermediate structure and processing steps in accordance with the invention. As shown in FIG. 2, an STI dielectric liner 20 is formed on the sidewalls of the trenches 18. The STI dielectric liner 20 may be formed by a conventional oxidation process of the SOI sidewall. An alternate method is to deposit a dielectric layer, possibly in conjunction with sidewall oxidation, and is anisotropically etched to remove any dielectric liner 20 formed on the BOX 12 (and pad nitride 16). In embodiments, the STI dielectric liner 20 is about 10 Å to 50 Å.

In embodiments, the STI dielectric liner 20 may also be formed on the exposed BOX 12, forming a Faraday cage. In this embodiment, the STI dielectric liner 20 is deposited within the shallow trench 18 in a conventional manner. In either scenario, the STI dielectric liner 20 is designed to shield the SOI from charge in the STI dielectric caused by radiation events.

Still referring to FIG. 2, a conductive liner 22 is formed over the STI dielectric liner 20. In embodiments the conductive liner is formed on the BOX 12, when the STI dielectric liner 20 is not formed thereon. The conductive liner 22 can be a metal or a metal alloy such as, for example, Ta, Ti, Ru, TaRu, TiN, TaN Al, W. The conductive liner 22 may be about 20 Å to 80 Å. The pad nitride layer 16 may also be polished to remove any residue.

Figure 3:
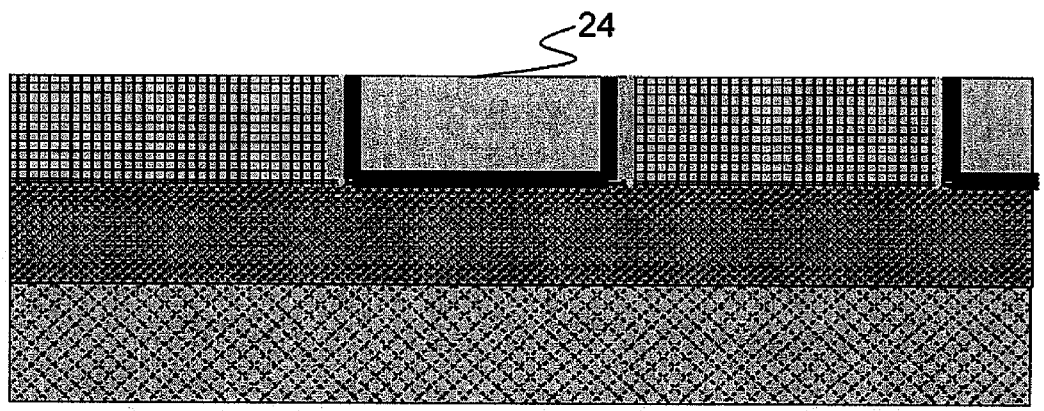
FIGS. 3 and 4 show alternate final structures and respective processing steps in accordance with the invention.
Figure 4:
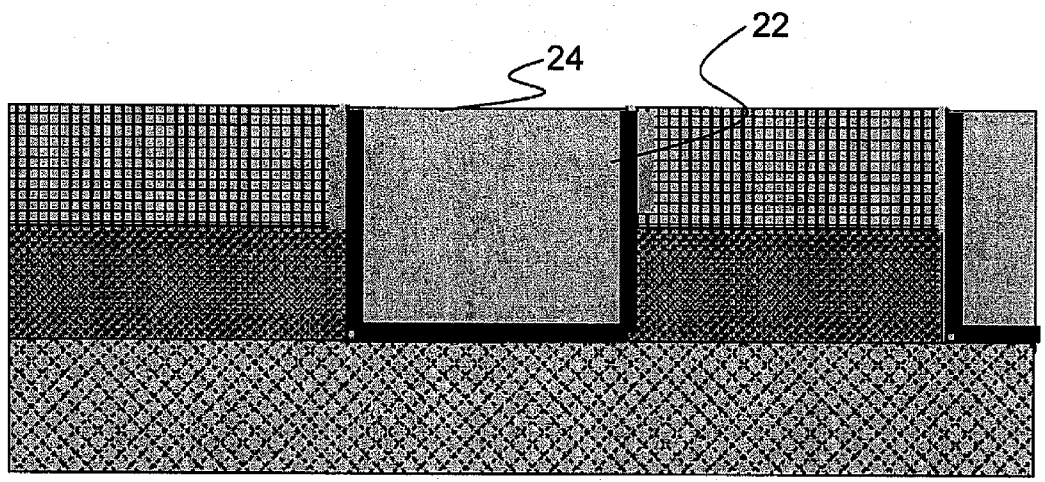

FIGS. 3 and 4 show alternate final structures and respective processing steps. Specifically, in FIG. 3, an STI fill step is performed to deposit oxide within the shallow trench thereby forming an STI structure 24. The pad nitride layer 16 may be stripped. Ideally, the STI structure 24 is flush with the SOI 14 prior to performing gate structures; although, it is understood that the STI structure 24 may be above or below the SOI 14 due to processing tolerances. The conductive liner must be electrically separated from the Gate electrode.

FIG. 4. shows the STI structure 24 extending through the BOX 12 to the wafer 10. In this embodiment, the etching step described in FIG. 2 would extend through the BOX 12. As should be understood, as a result of the oxidation process, the STI dielectric liner 20 would not be formed on the sidewalls of the BOX 12 and if any are formed on the bottom of the STI opening, need to be removed allowing the conductive liner to have an electrical contact to the substrate. The conductive liner 22, though, is formed on the BOX 12 and the exposed area of the wafer 10.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Design Structure

Figure 5:
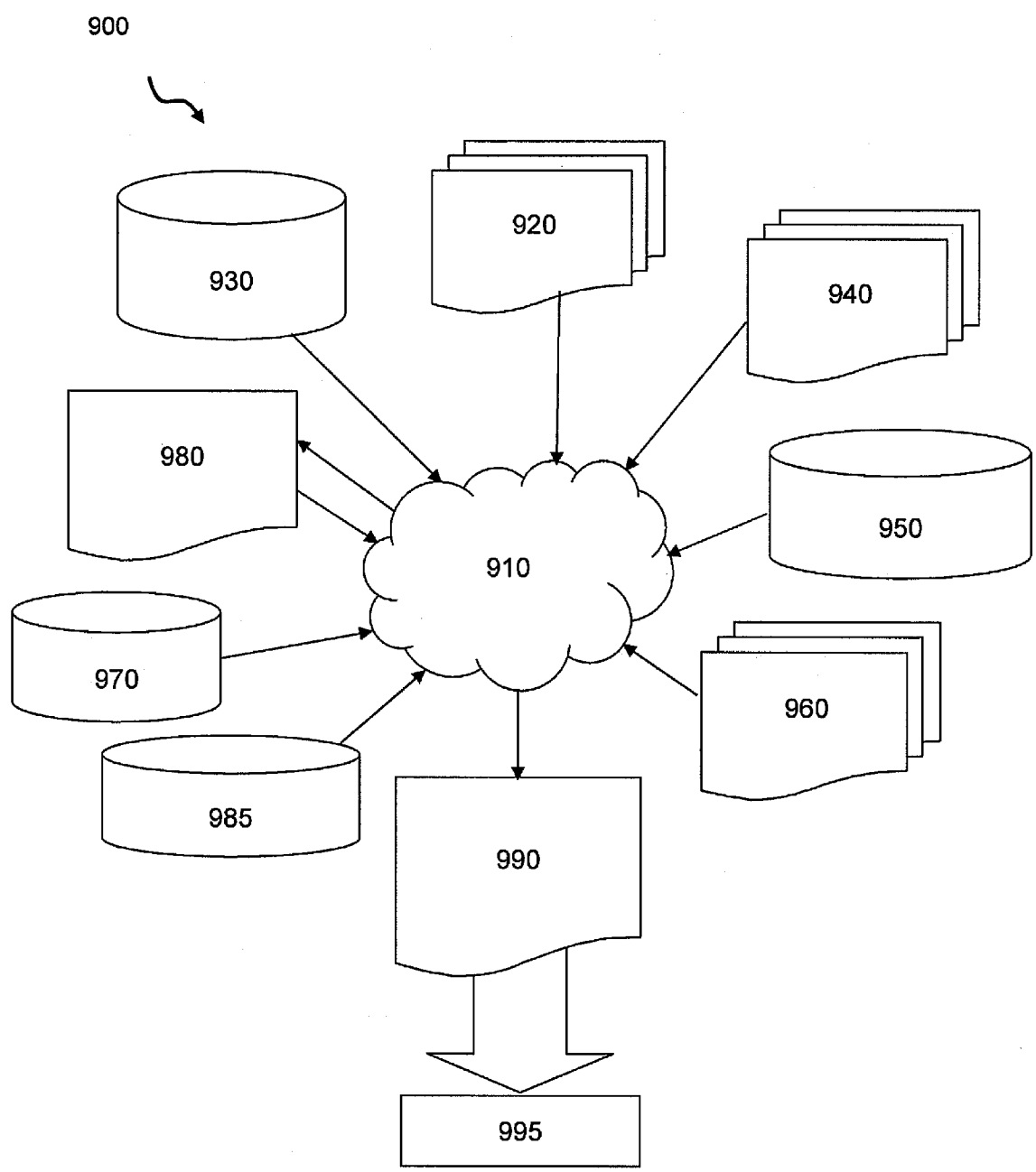
FIG. 5 is a flow diagram of a design process used in semiconductor design, manufacture, and/or test.

FIG. 5 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 3-4 in the form of schematics or HDL, a hardware-description language (e.g., Verilog, VHDL, C, etc.). Design structure 920 may be contained on one or more machine readable media. For example, design structure 920 may be a text file or a graphical representation of an embodiment of the invention as shown in FIGS. 3-4. Design process 910 preferably synthesizes (or translates) an embodiment of the invention as shown in FIGS. 3-4 into a netlist 980, where netlist 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 3-4, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3-4. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A structure, comprising:
   at least one shallow trench isolation structure comprised of oxide material and formed in a silicon (Si) layer;
   a dielectric liner formed on sidewalls of the Si layer within the at least one shallow trench isolation structure; and
   a metal or metal alloy layer formed in the at least one shallow trench isolation structure and between the dielectric liner on the sidewalls and the oxide material and directly on a buried oxide (BOX) layer under the Si layer such that the oxide material on a bottom of the shallow trench isolation structure is separated from the BOX layer by the metal or metal alloy layer.

2. The structure of claim 1, wherein the shallow trench isolation structure extends into the BOX layer to an underlying substrate.

3. The structure of claim 2, wherein the metal or metal alloy layer directly contacts the underlying substrate and the BOX layer.

4. The structure of claim 1, wherein the metal or metal alloy layer is directly on sidewalls of the BOX layer and an exposed portion of an underlying wafer.

5. The structure of claim 1, wherein the metal or metal alloy layer is in direct physical contact with the dielectric liner formed on the sidewalls of the Si layer, and the sidewalls have a single surface in the at least one shallow trench isolation structure.

6. The structure of claim 5, wherein the metal or metal alloy layer is sandwiched between the dielectric liner on the sidewalls and the oxide material.

7. The structure of claim 6, wherein the metal or metal alloy layer is a liner in direct physical contact with the dielectric liner and the oxide material is formed directly on the metal or metal alloy liner.

8. The structure of claim 7, wherein the metal or metal alloy liner covers the dielectric liner within the at least one shallow trench isolation structure.

9. The structure of claim 8, wherein the at least one shallow trench isolation structure includes a planar surface for the sidewalls extending from a top surface to a lower surface of the Si layer.

10. The structure of claim 9, wherein the dielectric liner is in direct, physical contact with the planar surface, the metal or metal alloy liner is in direct, physical contact with the dielectric liner and the oxide material fills the at least one shallow trench isolation, in direct contact with the metal or metal alloy liner.

11. A design structure embodied in a machine readable medium for designing, manufacturing, or testing an integrated circuit, the design structure comprising:
    at least one shallow trench isolation structure comprised of oxide material and formed in a silicon (Si) layer;
    a dielectric liner formed on sidewalls of the Si layer within the at least one shallow trench isolation structure; and
    a metal or metal alloy layer formed in the at least one shallow trench isolation structure and between the dielectric liner on the sidewalls and the oxide material and directly on a buried oxide (BOX) layer under the Si layer such that the oxide material on a bottom of the shallow trench isolation structure is separated from the BOX layer by the metal or metal alloy layer.

12. The design structure of claim 11, wherein the design structure comprises a netlist.

13. The design structure of claim 11, wherein the design structure resides on storage medium as a data format used for the exchange of layout data of integrated circuits.

14. The design structure of claim 11, wherein the design structure resides in a programmable gate array.

15. The design structure of claim 11, wherein:
    the metal or metal alloy layer is a liner in direct physical contact with the dielectric liner on the sidewalls and the oxide material is in direct physical contact on the metal or metal alloy liner;
    the metal or metal alloy liner is sandwiched between the dielectric liner formed on the sidewalls of the Si layer and the oxide material;
    the at least one shallow trench isolation structure includes a planar surface extending from a top surface to a lower surface of the Si layer; and
    the dielectric liner is in direct, physical contact with the planar surface, the metal or metal alloy liner is in direct, physical contact with the dielectric liner and the oxide material fills a remaining portion of the at least one shallow trench isolation, in direct physical contact with the metal or metal alloy liner.

* * * * *